United States Patent
Jose (10) Patent No.: US 9,239,899 B2
(45) Date of Patent: Jan. 19, 2016

(54) SYSTEM AND METHOD FOR IMPROVED TRANSACTION BASED VERIFICATION OF DESIGN UNDER TEST (DUT) TO MINIMIZE BOGUS FAILS

(71) Applicant: Wipro Limited, Bangalore (IN)

(72) Inventor: Jentil Jose, Kerala (IN)

(73) Assignee: Wipro Limited, Bangalore (IN)

( * ) Notice: Subject to any disclaimer, the term of this patent is extended or adjusted under 35 U.S.C. 154(b) by 0 days.

(21) Appl. No.: 14/260,510

(22) Filed: Apr. 24, 2014

(65) Prior Publication Data

US 2015/0261903 A1  Sep. 17, 2015

(30) Foreign Application Priority Data

Mar. 11, 2014 (IN) ............................ 1256/CHE/2014

(51) Int. Cl.
G06F 17/50 (2006.01)
G06F 11/00 (2006.01)
G01R 31/00 (2006.01)
G01R 27/28 (2006.01)
G01R 31/14 (2006.01)

(52) U.S. Cl.
CPC ........ *G06F 17/5063* (2013.01); *G06F 17/5022* (2013.01); *G01R 27/28* (2013.01); *G01R 31/14* (2013.01); *G06F 11/00* (2013.01); *G06F 17/5081* (2013.01); *G06F 2217/14* (2013.01)

(58) Field of Classification Search
CPC . G06F 11/00; G06F 17/5022; G06F 17/5081; G06F 2217/14; G06F 17/5063; G01R 31/00; G01R 31/14; G01R 27/28
USPC ............... 716/106, 136; 703/16; 702/59, 118; 714/32, 33, 37, 741; 324/528
See application file for complete search history.

(56) References Cited

U.S. PATENT DOCUMENTS

| | | | |
|---|---|---|---|
| 6,094,600 A * | 7/2000 | Sharpe et al. ................... 700/19 |
| 6,301,701 B1 * | 10/2001 | Walker et al. ................. 717/125 |
| 6,970,816 B1 * | 11/2005 | Bryan et al. .................... 703/22 |
| 8,015,454 B1 * | 9/2011 | Harrison et al. ............. 714/47.3 |
| 8,510,694 B2 * | 8/2013 | Hsieh et al. ................... 716/109 |
| 8,838,406 B2 | 9/2014 | Rivoir |
| 8,868,397 B2 * | 10/2014 | Alexanian et al. .............. 703/16 |
| 9,170,911 B1 * | 10/2015 | Atsatt ................. G06F 11/3041 1/1 |
| 2004/0111252 A1 | 6/2004 | Burgun et al. |
| 2004/0268200 A1 * | 12/2004 | Mak et al. ...................... 714/742 |
| 2010/0251192 A1 * | 9/2010 | Nishide ............................. 716/5 |
| 2011/0098973 A1 * | 4/2011 | Seidman ....................... 702/179 |
| 2011/0145919 A1 * | 6/2011 | Whelihan et al. ............... 726/22 |
| 2011/0276302 A1 | 11/2011 | Rivoir |
| 2013/0227367 A1 * | 8/2013 | Czamara et al. ............. 714/735 |
| 2014/0019807 A1 * | 1/2014 | Harrison et al. ................ 714/37 |

* cited by examiner

*Primary Examiner* — Phallaka Kik
(74) *Attorney, Agent, or Firm* — LeClairRyan, a Professional Corporation (57) ABSTRACT

A method and system for transaction-based verification of a design under test (DUT) by a test bench that configures the DUT with at least one configuration including one or more configuration values. At least one input to the DUT is applied to generate at least one output based on a configuration value. A list of changed one or more configuration values is associated with at least one abstract input transaction to generate at least one input transaction. A list of changed one or more configuration values is associated with one or more abstract output transactions to generate at least one output transaction. One or more expected transactions is generated based on the at least one input transaction using one or more transfer functions. An outcome is generated as pass/fail based on comparing the at least one output transaction with each of the one or more expected transactions.

24 Claims, 2 Drawing Sheets

SYSTEM AND METHOD FOR IMPROVED TRANSACTION BASED VERIFICATION OF DESIGN UNDER TEST (DUT) TO MINIMIZE BOGUS FAILS

CROSS-REFERENCE TO RELATED APPLICATIONS

This application claims the benefit of Indian Patent Application Filing Number 1256/CHE/2014, filed on Mar. 11, 2014, which is hereby incorporated by reference in its entirety.

FIELD

This disclosure relates generally to verify functionality of the design under test (DUT), and more particularly to simulation based functional verification of the DUT using transaction based approach.

BACKGROUND

Typically a simulation based functional verification includes a simulator to simulate the design, and a test bench to provide inputs and verify outcomes from the simulated design. When the digital design needs to be verified, the verification is performed at different levels such as: block or a group of blocks or the complete design. Each of these targets (block or a group of blocks or the complete design) is called Design Under Test (DUT) during this verification process.

Hardware Description Languages (HDLs) are predominantly used to describe integrated circuit designs. Various HDLs exist in the market today such as Very High Speed Integrated Circuit HDL (VHDL), Verilog, and System Verilog. HDL may be used to describe a design at various levels of abstraction. For instance, VHDL supports many possible levels/styles of design description. These styles differ primarily in how closely they relate to the underlying hardware. Some levels focus more on the behavior and dataflow of a design, while other levels focus more on the structural and timing aspects of the design.

For example, integrated circuit designs may be described at the dataflow level of abstraction, often called the register transfer level (RTL). In this intermediate level of abstraction, a design is described in terms of how data moves through the design. At the heart of most digital systems today are registers, and an RTL model describes how information is passed between registers in the design. This movement is synchronized at specific points of time which are indicated by the changes of values of a special design signal commonly known as a clock.

A verification environment for a DUT includes a test bench, which gives the essential stimulus as inputs to the DUT and checks correctness of the working of DUT.

Typically, a simulator software (for example VCS from Synopsis, NCSIM from Cadence, Modelsim from Mentor-Graphics etc.) is used to simulate the DUT working. The test bench is usually hosted on the simulator software. The simulator software requires the hardware description representation of the DUT (example VHDL/Verilog). The test bench components are coded using Hardware Verification languages for e.g. Specman/e or System Verilog etc.

Test bench for transaction based verification (TVB) is the most prominent type of test bench architecture. In short, TVB uses the concept of transactions to raise the verification effort to a higher level of abstraction for the purpose of improved productivity.

A test bench provides a set of components to verify the DUT and report success and failure. But, there are scenarios where a test bench shows failure when it is not an actual case failure, called bogus fails/false negatives.

A transaction can be a high level transaction (HLT) like configuring the entire Memory mapped registers (MMR) of a design or "read all registers" or low level transaction (LLT) like

[Type=doRead; addr=0xFF; data=0xF]

For example "read all registers" may involve several low-level transactions like the LLT. When the design is verified, the design is first configured. Test bench will provide the stimulus and monitor the response of the design. Then the response is compared with expected value to check the correctness of the design. It there is a match, it is pass otherwise it is failure. All designs have the configurability. As the number of test configurations increase, the number of test cases will increase in an exponential number. Increase in the number of test cases would entail license cost of the server that provides the simulation platform for the verification of the design and cost of the simulation tool.

One way to reduce the number of test cases is to configure the design multiple times in a single test case. One single test case comprises applying the stimulus, observing the response, and comparing the response with the expected response. There is a practical limitation associated with the configuring of the design multiple times in a single test case. When the configuration is being changed while the design is running, the configuration goes to both the test bench and the design. Therefore, when the design is operating, in the middle we are changing the configuration, there are times when the configuration seen by the test bench and the design are different. Because of these different configurations seen by the test bench and the design, there is mismatch between the response and the expected response. So the test may show a failure when actually it is not the case.

In the light of the above facts, there is a need for a smart test bench for improved transaction based verification of digital design to minimize bogus fails that can take into account the dynamic and random changes in the DUT configuration.

SUMMARY

Disclosed herein is a method for transaction based verification of a design under test (DUT) by a test bench. The method includes configuring the design under test with at least one configuration, the at least one configuration comprising one or more configuration values, the one or more configuration values changing during a transaction; applying at least one input to the DUT to generate at least one output, the at least one output based on a configuration value; associating a list of changed one or more configuration values with at least one abstract input transaction to generate at least one input transaction, the at least one abstract input transaction being generated by abstracting the at least one input; associating a list of changed one or more configuration values with one or more abstract output transactions to generate at least one output transaction, the one or more abstract output transactions being generated by abstracting the at least one output; determining one or more expected transactions based on the at least one input transaction using one or more transfer functions; generating an outcome as pass/fail based on comparing the at least one output transaction with each of the one or more expected transactions.

In another aspect of the present disclosure, a system for transaction based verification of a design under test (DUT) by a test bench is disclosed. The system includes a configuration interface to configure the design under test with at least one configuration, the at least one configuration comprising one or more configuration values, the one or more configuration values changing during a transaction; a DUT having at least one input to the DUT to generate at least one output, the at least one output based on a configuration value; a first transaction adder to: associate a list of changed one or more configuration values with at least one abstract input transaction to generate at least one input transaction, the at least one abstract input transaction being generated by abstracting the at least one input; a second transaction adder to: associate a list of changed one or more configuration values with one or more abstract output transactions to generate at least one output transaction, the one or more abstract output transactions being generated by abstracting the at least one output; a scoreboard to: determine one or more expected transactions based the at least one input transaction using one or more transfer functions; generate an outcome as pass/fail based on comparing the at least one output transaction with each of the one or more expected transactions.

It is to be understood that both the foregoing general description and the following detailed description are exemplary and explanatory only and are not restrictive of the invention, as claimed.

The accompanying drawings, which are incorporated in and constitute a part of this disclosure, illustrate exemplary embodiments and, together with the description, serve to explain the disclosed principles.

DETAILED DESCRIPTION

Figure 1:
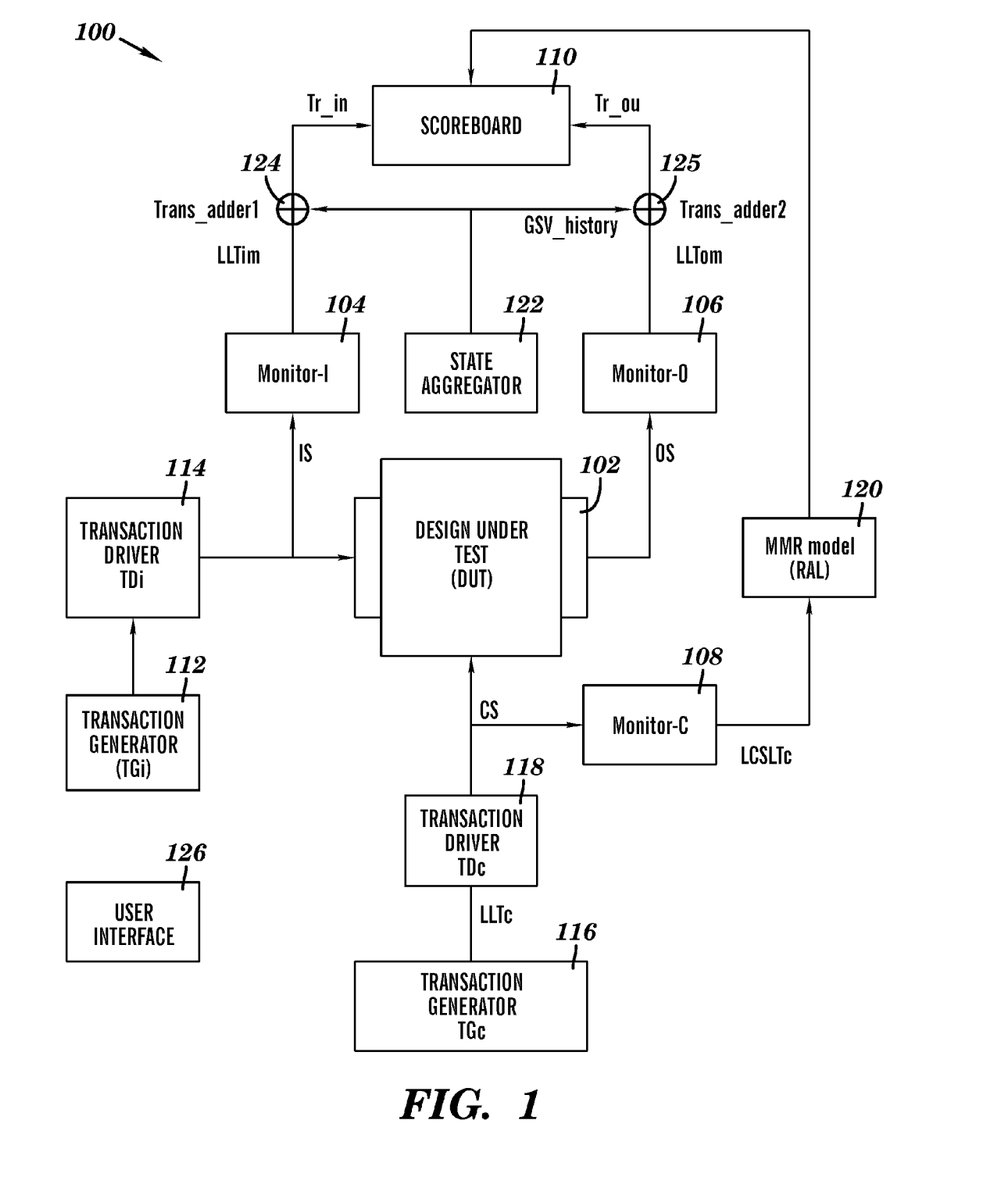
FIG. 1 is a schematic diagram illustrating an exemplary system for transaction based verification of digital design that can take into account the dynamic and random changes in the DUT configuration according to some embodiments of the present disclosure.

Exemplary embodiments are described with reference to the accompanying drawings. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims FIG. 1 illustrates schematic diagram illustrating an exemplary system 100 for transaction based verification of digital design that can take into account the dynamic and random changes in the DUT configuration according to some embodiments of the present disclosure. The system 100 may comprise a DUT 102, an input monitor (monitor-i) 104, an output monitor (monitor-o) 106, a configuration monitor (Monitor-c) 108, a scoreboard 110. Each of the above stated components can be implemented as a software module or component. The DUT 102 may receive a bunch of signals (input stimulus going to input side of the DUT 102. These signals may be part of a bus protocol like OCP (Open Core Protocol) or AHB (Advanced High performance Bus). The system 100 further may comprise a transaction generator 112 at input side of the DUT 102, a transaction driver 114 at the input side of the DUT. The transaction generator 112 may be communicatively coupled to the transaction driver 114. Similarly, the system 100 may comprise a transaction generator 116 at a configuration interface of the DUT 102, a transaction driver 118 at the configuration interface 102 which are communicatively coupled to each other. The aforementioned transaction generator, transaction driver can be implemented as a software module or component. Further, the scoreboard 110 may have access to instantaneous values of the configuration variables stored in the MMR model (RAL) 120. The MMR model (RAL) 120 is static and stores only the present value of the configuration. Further, the system 100 may comprise a state aggregator 122 and at least two transaction adders (124, 125). Also, the state aggregator 122 and the transaction adders (124,125) can be implemented as a software module or environment. Also, there is a user interface 126 through which a user configures the stimulus generators using constraint statements. Here, it is pertinent to know the difference between test case and the transaction by way of an example.

Example of a Testcase:
Configure the data processer to ADD mode, give random values of A and B
Example of a Transaction:
Configure data processor to ADD. So the test case is the whole process to test some feature of the design whereas a transaction is 1 step (or action you can say) done within the test case.

Now, the functionalities of the above stated components shall be explained by reference to FIG. 1

TGi—Transaction Generator at the input side

The transaction generator 112 may generate high level transaction (HLT) and breaks HLT into a set of LLT transaction in a sequence
  a. LLT may be of different types
    i. Bus transaction or Bus dependent transaction (read/write operation through the BUS)
    ii. Packet transaction of Transfer transactions (Sending data from Port A to Port B)

The transaction generator 112 may send LLT to the transaction driver at the input side, see example below—
Example: LLTi={Read (address) Response (data)}
TDi—The transaction driver at the input side The transaction driver 114 may transform a received LLT into corresponding input stimulus (IS) which contains actual signal transitions and sends that to the DUT 102. The transaction driver 114 may work in master mode or slave mode. In master mode, the transaction driver 114 may initiate the transaction and the DUT 102 responds, whereas in slave mode the DUT 102 may initiate the transaction and the transaction driver 114 responds to it, For example in case of a DUT read transaction, the driver responds with the read data.

Example: IS={Address, Data, Read, Response commands}
TGc

To verify the design, it needs to be configured. The design may have a configuration interface. The Transaction generator TGc 116 may generate randomized transactions that have to be performed at the configuration interface.

TDc

The TDc 118 is the driver may provide configuration signals. The TDc 118 may receive the configuration transactions LLTc from TGc and drives the signals of the configuration interface to implement the transaction.

Monitors

A monitor intercepts/receives signal (from a bus) and translates into a transaction record that can be made available to other components of the system.

Collects transactions (data items). A monitor extracts signal information from a bus and translates the information into a transaction that can be made available to other components and to the test writer.

Extracts events. The monitor detects the availability of information (such as a transaction), structures the data, and emits an event to notify other components of the availability of the transaction. A monitor also captures status information so it is available to other components and to the test writer.

Input Monitor (Monitor-i)

The input monitor 104 may gather the input stimulus as provided by the Transaction Driver 114 and converts it back to the LLT (Input LLT) i.e LLTim.

Output Monitor (monitor-o)

The output monitor 106 may gather output for input stimulus from the DUT 102 and converts it into Output LLT form. Example: LLTom=Write(address, data)

The state aggregator

The state aggregator 122 collects the state/config variable values in the system 100 so that it can be used by the scoreboard 110. This maintains a history of the past N values of the state variables and provides these values (global state variables GSV) to trans_adders.

The state aggregator 122 probe any variable in the DUT/RAL using hierarchial reference capabiity of the simulator. If the design and testbench is written in Verilog, we can use the verilog hierarchial access to probe the values of config variables in the design.

For example if below is the hierarchy of the testbench and design. At the top level we have the testbench, the design under test is instantiated as dut_1. Inside the DUT we have the config block named mmr_u1.mmr_u1 has a config signal config_sig1. The testbench can have a signal named probe1 which is used to get the value of the config variable using hierarchial reference.

The state aggregator 122 maintains the history of past values of the state variables (example config variables). This history is attached to the input Monitor—output monitor generated transactions using transaction adders (124, 125).

First Transaction adder (trans_adder1)

The output of the state aggregator 122 is a history of N past samples of configuration variables. This history is changing as we have more changes in the configuration variables. We need to store the history of the variables for each transaction going at input transaction interface of the scoreboard 110. The first transaction adder 124 take the state aggregate value and LLTim and generates an input transaction (Tr_in) that has embedded state aggregate history.

Second Transaction adder (Trans_adder2)

The output of the state aggregator is a history of N past samples of state variables. This history is changing as we have more changes in the state variables. We need to store the history of the variables for each transaction going at output transaction interface of the scoreboard 110. The second transaction adder 125 take the state aggregate value and LLTom and generates an output transaction (Tr_ou) that has embedded state aggregate history.

Scoreboard 110

The transaction based scoreboard 110 now has accessibility to history of configuration variables for each transaction. Hence the scoreboard 110 can adapt itself to the change in configuration variables per transaction. The scoreboard 110 need to predict the output. The scoreboard 110 may take the input and may predict expected output using function (input, configuration). Then the scoreboard may compare actual output against expected output. The conventional scoreboard takes one fixed configuration whereas the scoreboard 110 according to the present disclosure may take list of past N configuration variables, wherein N is greater than 1. Actually, N past configuration variables means N past values of the configuration variable. Configuration can simply means the written in a register. Configuration change does not mean any circuit change. Rather value stored in some of the flip flops (which stores the configuration value) changes.

For example, the design is a data processor. It has a configuration named process_mode. Process_mode is a variable inside the design. Process_mode can have values: [0: ADD, 1: SUB, 2: MUL]. Now as part of configuration, we need to set the configuration to the requirements, i.e, if we want the design to do only MUL, first the design has to be configured (this is done by doing a register write to process_mode by using a bus protocol). The bus protocol take few cycles to complete after which the process_mode variable inside design gets value 2. Now configuration of the design is over. Next phase we give random values to inputs A and B (A:B=0: 0, 1:2, 3:122 . . . ) and design give outputs after few cycles (Y=0, 2, 366 . . . )

Now assume we are giving input=(0:0, 1:2, 2:4, 4:5, 7:8 . . . ) and design is giving out=(0, 2, 8, 1, 56 . . . ). We change the config in between (MUL, MUL, SUB, MUL, MUL). Now the scoreboard see $4^{th}$ output as 1 .if scoreboard think it as out put of MUL its wrong (because 4*5=20, not 1, scoreboard take the present value of process_mode which is MUL) if scoreboard keep track of MUL,SUB, it can understand that, 1 happens because of SUB (4,5) so it pass. So, the scoreboard has to keep track of the change and history of the values of the configuration variable. It will minimize the case of bogus fails/false negatives.

The conventional scoreboard always takes the transfer function (TF) which is applicable when the LLTim is received and does not change it in between when the value of the configuration variables (from 2 to 1) got changed. The reason is—The conventional scoreboard considers the TF to be a fixed function for each LLTim, it does not allow TF to be changing for one LLTim while the transaction is in transit.

Definitions:

MMR—model (RAL)—Testbench model of the MMR usually the register abstraction layer (RAL)

This is a standard verification component used to model the registers in the design. The RAL can remember the written values to the MMR and can predict the value of reads from MMR.

LLTi—The Low level transaction generated by TGi

The actual digital representation of the stimulus (signal transitions) in IS. These values and transitions are generated by TDi 116 based on the TGi inputs 118.

LLTim—The transaction generated by input monitor

The input monitor 104 may monitors the IS, it captures the transaction in IS and generate LLTim which are abstracted form of actual LLTi transactions happening in IS. LLTim is used by transaction level scoreboards.

LLTom—The transaction generated by output monitor

The output monitor 106 may monitor the design output, it may capture the transaction in output and generate LLTom which are abstracted form. LLTom is used by transaction level scoreboards.

CS—Configuration Signals

This is a set of signals that represents the configuration stimulus from the TDc 118 to the DUT 102 with copy to the configuration monitor 108.

LLTc—Low Level Transaction for configuring the DUT

The actual digital representation of the signal values and transitions of the CS.

Output Monitor for DUT configuration

May captures the CS and converts into corresponding digital form LCSLTC.

LCSLTC

Digital representation of the CS. Typically the information in LLTc and LCSLTC can be very similar. LCSLTC is used by scoreboards and other models to verify the design.

In order to explain further, let's take a sample design, a simple DMA controller block (DCB). The block reads source data from specified source address and writes it into a specified destination address. The DCB has a source address register (SA) which holds the starting address (source base address—SBA) of the source memory region, a destination address register (DA) which hold the starting address (destination base address—DBA) of the destination memory region. The address calculation for read from the source is—
read_address=SBA+4*index;

The address calculation for read from the source is dependent on the "k" field in DMACTRL register:

| DMA type (k) | Destination address calculation |
|---|---|
| 0 | write_address = DBA + 4 * index |
| 1 | write_address = DBA + 1024 * index |
| 2 | write_address = DBA + 2048 * index |

The number of data elements transferred in 1 DMA operation is decided by the dma_count field in the DMACTRL register. Upon a DMA request the design will start reading from the first source address and write the data to the first destination address (index=0), the address of the source and destination is updated as explained above (each time, index=index+1) and second transfer occurs, the process continues for dma_count number of times. There are several aspects to be verified here; however for the sake of simplicity we take only the verification of data flow from input interface to output interface. First, we use traditional DMA test bench. The configuration transaction generator 116 creates write transactions to configure the MMRs of the DMA controller. This sets the source and destination start address, dma_count and the DMA_type. The configuration transactions also trigger a DMA.

Upon the DMA trigger, the design starts giving read transaction requests on IS, the TDi 114 and TGi 114 provide the read response data to the design. The design does the write access through OS.

The Monitor-I 104 and Monitor—O 106 captures the read and write transactions (LLim and LLTom) and gives to the scoreboard 110. Now the LLTs of input and output are compared in the transaction level scoreboard. This way the verification of data flow from input interface to output interface is verified.

The scoreboard 110 maintains a queue of LLTims called LLTim_q. Whenever a LLTom is received, it tries to match the LLTom with any of the elements in LLTim, if a match is found that LLTim element is removed from LLTim_q. If a match is not found it reports a fail.

The transfer function TF is derived from the destination address generation table=
TF[ ]={index=input address−SBA; return DBA+index*k;}

| DMA type | k | Destination address calculation |
|---|---|---|
| 0 | 4 | write_address = DBA + 4 * index |
| 1 | 1024 | write_address = DBA + 1024 * index |
| 2 | 2048 | write_address = DBA + 2048 * index |

Now lets take a simple scenario—the MMR—DMA type and therefor TF ( ) is constant in one simulation with the following set of state variables/configuration variables. SBA=0x1000_0000, DBA=0xF000_0000, Tr_count=7 and DMA type=0.

Here in this scenario, the Transfer function TF[in] is:

| Cycle | LLTim [Address, Data] | TF &SV's | LLTom [Address, Data] | LLTexp [Address, Data] | Final interpretation of result by SB |
|---|---|---|---|---|---|
| 1 | [READ, 0x1000_0000, 00001] | TF[0] | | | |
| 2 | [READ, 0x1000_0004, 00002] | TF[0] | | | |
| 3 | [READ, 0x1000_0008, 00003] | TF[0] | | | |
| 4 | [READ, 0x1000_000C, 00004] | TF[0] | [WRITE, 0xf000_0000, 00001] | [WRITE, 0xf000_0000, 00001] | PASS |
| 5 | [READ, 0x1000_0010, 00005] | TF[0] | [WRITE, 0xf000_0004, 00002] | [WRITE, 0xf000_0004, 00002] | PASS |
| 6 | [READ, 0x1000_0014, 00006] | TF[0] | [WRITE, 0xf000_0008, 00003] | [WRITE, 0xf000_0008, 00003] | PASS |
| 7 | [READ, 0x1000_0018, 00007] | TF[0] | [WRITE, 0xf000_000C, 00004] | [WRITE, 0xf000_000C, 00004] | PASS |
| 8 | | | [WRITE, 0xf000_0010, 00005] | [WRITE, 0xf000_0010, 00005] | PASS |

-continued

| LLTim Cycle [Address, Data] | TF &SV's | LLTom [Address, Data] | LLTexp [Address, Data] | Final interpretation of result by SB |
|---|---|---|---|---|
| 9 | | [WRITE, 0xf000_0014, 00006] | [WRITE, 0xf000_0014, 00006] | PASS |
| 10 | | [WRITE, 0xf000_0018, 00007] | [WRITE, 0xf000_0018, 00007] | PASS |
| 11 | | | | |

TF[ ]={index=input address—SBA; return DBA+index*4;}

The test case will pass without any issues in the simple scenario.

But consider a situation, when one or more of the configuration variables's (k) got changed. This can happen if the TGc 116 (configuration transaction generator) is randomized to improve the coverage.

In below scenario, we assume that the DMA type CV is not constant in one simulation.

Initially it was:
SA=0x1000_0000, DBA=0xF000_0000. Tr_count=7, DMA type=0

But the DMA type (k) SV got changed to DMA type=2;

Here in this scenario, the scoreboard 110 should use the following 2 Transfer functions to determine expected output:
DMA type=0
TF[0]={index=input address—SBA; return DBA+index*4}; // k=4 DMA type=2
TF[2]={index=input address—SBA, return DBA+index*2048}; // k=2048

Here The SB (scoreboard) 110 always takes the TF which is applicable when the LLTim is received and does not change it in between when the value of the state variables (SV) (DMA type, k) got changed. The reason is—The scoreboard 110 considers the TF to be a fixed function for each LLTim, it does not allow TF to be changing for one LLTim while the transaction is in transit.

In this example, when DMA Type=0 initially, the SB 110 uses TF[0] to determine expected output and the DUT actual Output is also equivalent to TF[0].

But when DMA Type value got changed to DMA Type=2 after a few cycles, the DUT actual output is aligned to TF[2] whereas the SB 110 determines expected output using the initial transfer function TF[0]. And hence the result of comparison of "expected output" and "actual output" is going to be a "Fail".

We can see a fail in cycle 5. Although, the DUT may have produced correct actual output, this is reported as a "Fail" (Bogus Fail) by the SB 110.

Now we will see the application of smart test bench (shown in FIG. 1) in the DMA example—

| LLTim Cycle [Address, Data] | TF &SV's/ CV's | Output LLTom [Address, Data] | LLTexp [Address, Data] | Final interpretation of result by SB |
|---|---|---|---|---|
| 1 [READ, 0x1000_0000, 00001] | TF[0] | | | |
| 2 [READ, 0x1000_0004, 00002] | TF[0] | | | |
| 3 [READ, 0x1000_0008, 00003] | TF[2] | | | |
| 4 [READ, 0x1000_000C, 00004] | TF[2] | [WRITE, 0xf000_0000, 00001] | [WRITE, 0xf000_0000, 00001] | PASS |
| 5 [READ, 0x1000_0010, 00005] | TF[2] | [WRITE, 0xf000_0800, 00002] | [WRITE, 0xf000_0004, 00002] | FAIL |
| 6 [READ, 0x1000_0014, 00006] | TF[2] | [WRITE, 0xf000_1800, 00003] | [WRITE, 0xf000_1800, 00003] | PASS |
| 7 [READ, 0x1000_0018, 00007] | TF[2] | [WRITE, 0xf000_2000, 00004] | [WRITE, 0xf000_2000, 00004] | PASS |
| 8 | | [WRITE, 0xf000_2800, 00005] | [WRITE, 0xf000_2800, 00005] | PASS |
| 9 | | [WRITE, 0xf000_3000, 00006] | [WRITE, 0xf000_3000, 00006] | PASS |
| 10 | | [WRITE, 0xf000_3800, 00007] | [WRITE, 0xf000_3800, 00007] | PASS |
| 11 | | | | |

Let's consider that we use N TFs where N=4. (I.e. we store 4 TFs).

| Cycle | Input LLTim [Address, Data] | TF & SV's | GSV | LLTom [Address, Data] | LLTexp [Address, Data] | Final interpretation of result by SB |
|---|---|---|---|---|---|---|
| 1 | [READ, 0x1000_0000, 00001] | TF[0] | | | | |
| 2 | [READ, 0x1000_0004, 00002] | TF[0] | | | | |
| 3 | [READ, 0x1000_0008, 00003] | TF[2] | | | | |
| 4 | [READ, 0x1000_000C, 00004] | TF[2] | TF[0]/ TF[2] | [WRITE, 0xf000_0000, 00001] | [WRITE, 0xf000_0000, 00001 | PASS |
| 5 | [READ, 0x1000_0010, 00005] | TF[2] | TF[0]/ TF[2] | [WRITE, 0xf000_0800, 00002] | [WRITE, 0xf000_0004, 00002] OR [WRITE, 0xf000_0800, 00002] | PASS |
| 6 | [READ, 0x1000_0014, 00006] | TF[2] | TF[2] | [WRITE, 0xf000_1800, 00003] | [WRITE, 0xf000_1800, 00003] | PASS |
| 7 | [READ, 0x1000_0018, 00007] | TF[2] | TF[2] | [WRITE, 0xf000_2000, 00004] | [WRITE, 0xf000_2000, 00004] | PASS |
| 8 | | | TF[2] | [WRITE, 0xf000_2800, 00005] | [WRITE, 0xf000_2800, 00005] | PASS |
| 9 | | | TF[2] | [WRITE, 0xf000_2000, 00006] | [WRITE, 0xf000_3000, 00006] | PASS |
| 10 | | | TF[2] | [WRITE, 0xf000_2800, 00007] | [WRITE, 0xf000_3800, 00007] | PASS |
| 11 | | | | | | |

We also have the option of specifying only 1 specific TF out of N TF s, for example, the design specification mandates that GSV at 2 clock before the output packet decided the TF, we can use TF[GSV[t−2]] only.

The test bench is implemented in object oriented language, the GSV_history is a base class and Tr_in and TR_out use a pointer of type GSV_history to store the state variables history. This helps to model changes in TFs even on a per transaction basis.

Figure 2:
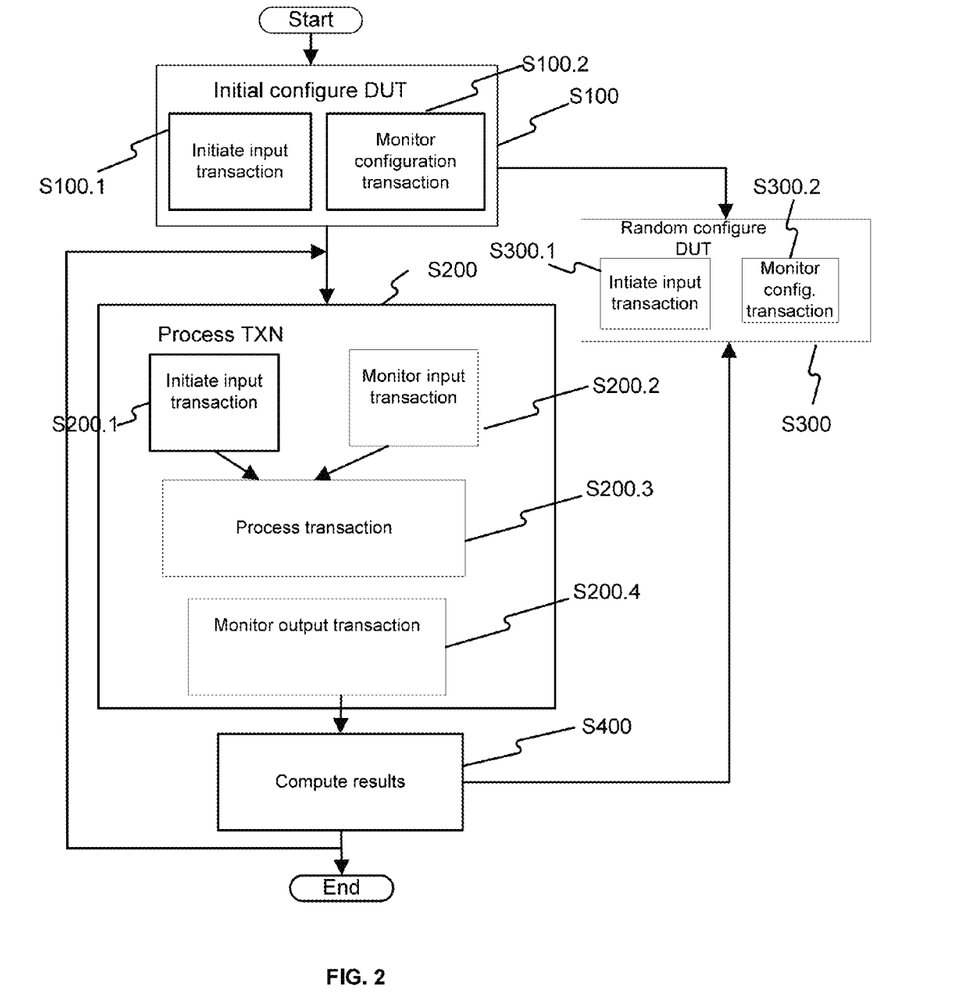
FIG. 2 is a flowchart illustrating method for transaction based verification of digital design that can take into account the dynamic and random changes in the DUT configuration according to some embodiments of the present disclosure.

FIG. 2 is a flowchart illustrating method for transaction based verification of digital design that can take into account the dynamic and random changes in the DUT configuration according to some embodiments of the present disclosure. The method according to present disclosure maintains the history of the state variables. The history is provided to the scoreboard 110 per transaction. The scoreboard 110 may adapt the transfer function TF based on changes in the configuration/state variables.

Let's assume that TF depends on variables x0, x1 ... xn. The state aggregator always samples these variables and creates a global complex variable that contains these variables. GSV={x0, x1, ... xn}. Also the state aggregator 122 maintains the past N values of the GSV called GSV_history, GSV_history={GSV[t], GSV[t−1], GSV[t−2] ... GSV[t−N+1]}. The state aggregator get the State variables from simulator.

The transaction adders (124, 125) take the transaction output at Input/output monitor and add the GSV_history to create Tr_in and Tr_out. The scoreboard Match function use N TF functions instead of 1 TF. The N TF functions are created using TF[GSV[t]], TF[GSV[t−1]], TF[GSV[t−2]] ... TF[GSV[t−N+1]]. For each output transaction the scoreboard calculates each of the above TFs, if any of the TF results in a match the scoreboard pass.

At step S100, TGc 116 and TDc 118 give configuration transaction to the DUT 102 so as to configure it. S100 comprises further steps. At S100.1, the transaction driver TDc 116 drives the signals of configuration interface of the DUT 102 completes configuration. At step S100.2, whenever DUT configuration interface gets a transaction, the physical transaction is abstracted to generate abstract transaction. The configuration monitor 108 monitors the input form of the physical transaction as received by the DUT 102 by taking a copy of actual signal from the configuration interface side of the DUT 102. The configuration monitor 108 then converts copy of the physical transaction into the abstract transaction.

Further, step S200 is related to the process transaction. At step S200.1, input transaction is initiated. The transaction generator TGi 112 generates random transaction. The TDi 114 obtains generated transactions from the TGi 112. The TDi 114 converts the generated transactions into actual signal values and transitions in digital form (physical transaction), there by implementing the transaction. At step S200.2, the input transaction is monitored. The input monitor 104 monitors the inputs of the physical transaction as provided by TDi 114 by taking a copy of the actual signal at the input side of the DUT 102. The input monitor 104 then converts the copy of the physical transaction into the form of abstract input transaction (similar to the structure of the random transaction). The input monitor 104 then sends the abstract input transaction to the first transaction adder 124. The first transaction adder (Trans_adder1)124 gathers past N values of the configuration registered by state aggregator 122, N being greater that zero. The first transaction adder 124 obtains the abstract input transaction from the input monitor 104. The first transaction adder 124 then associates the obtained abstract input transaction with pointers to past N values of the configuration to create an input transaction. The first Transaction adder then sends the input transaction to the scoreboard 110.

At step S200.3, the design—DUT 102 takes the physical transaction as input and processes it and generates the output in the form of a physical transaction.

At step 200.4, the output transaction is monitored. The output monitor 106 monitors the inputs of the physical transaction as provided by DUT output by taking a copy of the actual signal at the output side of the DUT 102. The output monitor 106 then converts the copy of the physical transaction into the form of abstract output transaction. The output monitor 106 then sends the abstract input transaction to the second transaction adder 125.

The history of configuration variables is associated with the output monitor's output. The second transaction adder 125 gathers all values of the all the relevant configuration variables registered by state aggregator 122 during the scope of the output transaction as the output of the state aggregator. The second transaction adder 125 obtains the abstract transaction from the output monitor 106. The second transaction adder 125 associates the obtained abstract input transaction with the pointer to list of N past configuration to create an output transaction. The second transaction adder 125 then sends output transaction to the scoreboard 110.

At step S300, DUT102 is configured. At step S300.1, TGc 116 and TDc 118 give data input transactions to the DUT 102. The transaction driver TDc 116 drives the signals of configuration interface of the DUT 102 and completes configuration transactions. At step S300.2, the physical configuration transactions are abstracted and an transaction is generated. This transaction is used by RAL models.

At step S400, operation of computing the results is done in transaction based scoreboard 110.

The scoreboard 110 may get input transaction and output transaction from transaction adder 124 and the transaction adder 125, respectively. It also has the access to RAL to get the instantaneous values of configuration variables. The Match function checks if the match between the input transaction and the output transaction is true for any of the past N values of the configuration variables. The result is a fail only if the match cannot find in any of these N values of the configuration variables.

The illustrated steps are set out to explain the exemplary embodiments shown, and it should be anticipated that ongoing technological developments will change the manner in which particular functions are performed. These examples are presented herein for purposes of illustration, and not limitation. It is apparent to a person skilled in the art that the sequence of the steps in the flowchart is not static and is exemplary only. It should not be construed as a limitation. The sequence in which the steps are performed may change. Further, the boundaries of the functional building blocks have been arbitrarily defined herein for the convenience of the description.

Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope and spirit of disclosed embodiments being indicated by the following claims.

What is claimed is:

1. A method for transaction based verification of a design under test (DUT) by a test bench, the method comprising:

configuring, by a transaction based verification computing device, the design under test with at least one configuration, the at least one configuration comprising one or more configuration values, the one or more configuration values changing during a transaction;

applying, by the transaction based verification computing device, at least one input to the DUT to generate at least one output, the at least one output based on a configuration value;

associating, by the transaction based verification computing device, a list of changed one or more configuration values with at least one abstract input transaction to generate at least one input transaction, the at least one abstract input transaction being generated by abstracting the at least one input;

associating, by the transaction based verification computing device, a list of changed one or more configuration values with one or more abstract output transactions to generate at least one output transaction, the one or more abstract output transactions being generated by abstracting the at least one output;

determining, by the transaction based verification computing device, one or more expected transactions based on the at least one input transaction using one or more transfer functions;

generating, by the transaction based verification computing device, an outcome as pass/fail based on comparing the at least one output transaction with each of the one or more expected transactions, wherein the generating, by the transaction based verification computing device, identifies the outcome as the fail only when a match between the at least one output transaction and each of the one or more expected transactions cannot be identified for any of the one or more configuration values changed during the transaction.

2. The method of claim 1, wherein each of the one or more transfer functions is based on corresponding configuration value of the changed one or more configuration values during the transaction.

3. The method of claim 1, wherein each of the one or more transfer functions is based on functional specification of the DUT.

4. The method of claim 1, further comprising storing, by the transaction based verification computing device, list of changed one or more configuration values.

5. The method of claim 1, further comprising providing, by the transaction based verification computing device, access to instantaneous value of the configuration to a scoreboard.

6. The method of claim 1, wherein the associating the list of changed one or more configuration values with the one or more abstract input transactions further comprises:
adding, by the transaction based verification computing device, pointers to one or more configuration values to the one or more abstract input transactions.

7. The method of claim 1, wherein the associating the list of changed one or more configuration values with the one or more abstract output transactions comprises:
adding, by the transaction based verification computing device, a pointer to one or more configuration values to the one or more abstract output transactions.

8. The method of claim 1, wherein the applying one or more input values to the DUT occurs independently of the configuring the design under test with at least one configuration.

9. A transaction based verification computing device,
one or more processors;
a memory coupled to the one or more processors which are configured to be capable of executing programmed instructions stored in the memory to and that comprise:
configure the design under test with at least one configuration, the at least one configuration comprising one or more configuration values, the one or more configuration values changing during a transaction;
apply at least one input to the DUT to generate at least one output, the at least one output based on a configuration value;
associate a list of changed one or more configuration values with at least one abstract input transaction to generate at least one input transaction, the at least one abstract input transaction being generated by abstracting the at least one input;
associate a list of changed one or more configuration values with one or more abstract output transactions to generate at least one output transaction, the one or more abstract output transactions being generated by abstracting the at least one output;
determine one or more expected transactions based on the at least one input transaction using one or more transfer functions;
generate an outcome as pass/fail based on comparing the at least one output transaction with each of the one or more expected transactions, wherein the generate identifies the outcome as the fail only when a match between the at least one output transaction and each of the one or more expected transactions cannot be identified for any of the one or more configuration values changed during the transaction.

10. The device of claim 9, wherein each of the one or more transfer functions is based on corresponding configuration value of the changed one or more configuration values during the transaction.

11. The device of claim 9, wherein each of the one or more transfer functions is based on functional specification of the DUT.

12. The device of claim 9, wherein the memory coupled to the one or more processors is further configured to be capable of executing programmed instructions stored in the memory to and that comprise store list of changed one or more configuration values.

13. The device of claim 9, wherein the memory coupled to the one or more processors is further configured to be capable of executing programmed instructions stored in the memory to and that comprise provide access to instantaneous value of the configuration to a scoreboard.

14. The device of claim 9, wherein the memory coupled to the one or more processors is further configured to be capable of executing programmed instructions stored in the memory for the associate the list to and that comprise add pointers to one or more configuration values to the one or more abstract input transactions.

15. The device of claim 9, wherein the memory coupled to the one or more processors is further configured to be capable of executing programmed instructions stored in the memory for the associate the list to and that comprise add a pointer to one or more configuration values to the one or more abstract output transactions.

16. The device of claim 9, wherein the memory coupled to the one or more processors is further configured to be capable of executing programmed instructions stored in the memory for the apply at least one input to the DUT to and that comprise apply one or more input values to the DUT independently of the configure the design under test with at least one configuration.

17. A non-transitory computer readable medium having stored thereon instructions for transaction based verification of a design under test (DUT) by a test bench comprising machine executable code which when executed by a processor, causes the processor to perform steps to and that comprise:
configure the design under test with at least one configuration, the at least one configuration comprising one or more configuration values, the one or more configuration values changing during a transaction;
apply at least one input to the DUT to generate at least one output, the at least one output based on a configuration value;
associate a list of changed one or more configuration values with at least one abstract input transaction to generate at least one input transaction, the at least one abstract input transaction being generated by abstracting the at least one input;
associate a list of changed one or more configuration values with one or more abstract output transactions to generate at least one output transaction, the one or more abstract output transactions being generated by abstracting the at least one output;
determine one or more expected transactions based on the at least one input transaction using one or more transfer functions;
generate an outcome as pass/fail based on comparing the at least one output transaction with each of the one or more expected transactions, wherein the generate identifies the outcome as the fail only when a match between the at least one output transaction and each of the one or more expected transactions cannot be identified for any of the one or more configuration values changed during the transaction.

18. The medium of claim 17, wherein each of the one or more transfer functions is based on corresponding configuration value of the changed one or more configuration values during the transaction.

19. The medium of claim 17, wherein each of the one or more transfer functions is based on functional specification of the DUT.

20. The medium of claim 17, further comprises store list of changed one or more configuration values.

21. The medium of claim 17, further comprises provide access to instantaneous value of the configuration to a scoreboard.

22. The medium of claim 17, wherein the associate the list further comprises add pointers to one or more configuration values to the one or more abstract input transactions.

23. The medium of claim 17, wherein the associate the list further comprises add a pointer to one or more configuration values to the one or more abstract output transactions.

24. The medium of claim 17, wherein the apply at least one input to the DUT further comprises apply one or more input values to the DUT independently of the configure the design under test with at least one configuration.

\* \* \* \* \*